US012593412B2

(12) United States Patent
Sugahara et al.

(10) Patent No.: US 12,593,412 B2
(45) Date of Patent: Mar. 31, 2026

(54) ELECTRONIC CONTROL DEVICE

(71) Applicant: Hitachi Astemo, Ltd., Hitachinaka (JP)

(72) Inventors: Ryujo Sugahara, Hitachinaka (JP); Hidetatsu Yamamoto, Hitachinaka (JP); Daisuke Tanaka, Hitachinaka (JP); Eiji Ichikawa, Hitachinaka (JP); Michihito Watarai, Hitachinaka (JP); Hideyuki Sakamoto, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 154 days.

(21) Appl. No.: 18/008,464

(22) PCT Filed: May 20, 2021

(86) PCT No.: PCT/JP2021/019181
§ 371 (c)(1),
(2) Date: Dec. 6, 2022

(87) PCT Pub. No.: WO2022/004184
PCT Pub. Date: Jan. 6, 2022

(65) Prior Publication Data
US 2023/0209738 A1     Jun. 29, 2023

(30) Foreign Application Priority Data
Jul. 1, 2020    (JP) ................................. 2020-113711

(51) Int. Cl.
| H05K 1/14 | (2006.01) |
| H05K 5/00 | (2006.01) |
| H05K 5/06 | (2006.01) |

(52) U.S. Cl.
CPC ............. *H05K 5/0069* (2013.01); *H05K 1/14* (2013.01); *H05K 5/069* (2013.01)

(58) Field of Classification Search
CPC ......... H05K 5/0069; H05K 5/069; H05K 1/14
USPC .................. 361/752, 728, 796, 800
See application file for complete search history.

(56) References Cited

U.S. PATENT DOCUMENTS

| 4,979,075 | A | * | 12/1990 | Murphy | ................... G06F 1/184 |
| | | | | | 361/810 |
| 5,513,329 | A | * | 4/1996 | Pecone | ................. G06F 13/409 |
| | | | | | 710/301 |
| 10,007,307 | B1 | * | 6/2018 | Zhou | ........................ G06F 1/184 |
| 2004/0094328 | A1 | * | 5/2004 | Fjelstad | ............... H01R 12/714 |
| | | | | | 174/251 |
| 2007/0117416 | A1 | * | 5/2007 | Peterson | ............ H01R 12/7011 |
| | | | | | 439/64 |

(Continued)

FOREIGN PATENT DOCUMENTS

| FR | 2838283 | A1 | * | 10/2003 | ............... H05K 1/14 |
| JP | S63-140697 | A | | 9/1988 | |

(Continued)

*Primary Examiner* — Hung S. Bui
(74) *Attorney, Agent, or Firm* — Volpe Koenig

(57) ABSTRACT

An electronic control device includes: a first board on which a bus bridge and an external communication connector are mounted; a second board on which an accelerator SoC is mounted, the second board being electrically connected to the first board; and a B-to-B connector capable of performing signal transmission between the bus bridge and the accelerator SoC.

5 Claims, 5 Drawing Sheets

(56) References Cited

U.S. PATENT DOCUMENTS

| | | | |
|---|---|---|---|
| 2008/0046617 A1* | 2/2008 | Lee | G06F 13/409 |
| | | | 710/104 |
| 2008/0264192 A1* | 10/2008 | Christensen | H05K 7/1409 |
| | | | 74/469 |
| 2010/0122841 A1* | 5/2010 | Jang | H05K 1/14 |
| | | | 174/260 |
| 2012/0069510 A1* | 3/2012 | Tan | G06F 1/184 |
| | | | 361/679.02 |
| 2013/0007328 A1* | 1/2013 | Peng | G06F 1/181 |
| | | | 710/301 |
| 2020/0143670 A1 | 5/2020 | Kitani et al. | |
| 2023/0413486 A1* | 12/2023 | Reinhold | H05K 7/20854 |

FOREIGN PATENT DOCUMENTS

| | | | | | |
|---|---|---|---|---|---|
| JP | 2003-304083 A | | 10/2003 | | |
| JP | 2004-341881 A | | 12/2004 | | |
| JP | 2006113273 A | * | 4/2006 | | G03G 15/00 |
| JP | 2007048890 A | * | 2/2007 | | H05K 7/14 |
| JP | 2010078516 A | * | 4/2010 | | H05K 9/00 |
| JP | 2011-108955 A | | 6/2011 | | |
| JP | 2012-043254 A | | 3/2012 | | |
| JP | 2012-165033 A | | 8/2012 | | |
| JP | 2012175031 A | * | 9/2012 | | H05K 5/0065 |
| JP | 2013-207161 A | | 10/2013 | | |
| JP | 2014012165 A | * | 1/2014 | | A63F 7/02 |
| JP | 2018-190045 A | | 11/2018 | | |
| JP | 7118216 B1 | * | 8/2022 | | H05K 7/14 |

* cited by examiner

ELECTRONIC CONTROL DEVICE

TECHNICAL FIELD

The present invention relates to an electronic control device.

BACKGROUND ART

In recent years, an electronic control device used in an automobile has a printed circuit board on which a semiconductor device and the like are mounted in the inside thereof. In an electronic control device (ECU) for automatic driving, along with the rise of an automatic driving level, it is necessary for the ECU to perform communication processing of a large amount of data at a high speed. The ECU performs arithmetic processing on image data and signal data obtained by a camera, a radar, or the like, and transmits a signal to another ECU that controls power steering, braking or the like. In this case, the number of sensors and the processing performance required by a system on chip (SoC) for image processing differ depending on a type and an option of an automobile. Accordingly, a circuit board becomes large-sized and diversified.

As one of techniques for suppressing an increase in size of an electronic control device, there has been proposed a technique where a printed circuit board is divided into a motherboard and a plurality of daughter boards, and these printed circuit boards are connected by Board-to-Board (B to B) connectors. The B-to-B connector is a connector that has an insulating housing and a plurality of conductive terminals, and is suitable for high-speed communication. However, in a case where a plurality of printed circuit board is connected by a B-to-B connector, in connecting electronic components such as SoCs that require high-speed communication by wiring, a wiring length is increased. This increase of the wiring length has a concern that signal quality of high-speed communication is adversely affected. Accordingly, there has been a demand for measures that can overcome such a concern.

As one of such measures, for example, a technique described in patent literature 1 is known. Patent literature 1 discloses a technique where an interface circuit is disposed on one side of a wiring circuit board and a memory circuit is disposed on the other side of the wiring circuit board, and the interface circuit and the memory circuit are each provided with a control PLL circuit without controlling the same PLL circuit. As a result, a transmission path from the interface circuit to the PLL control circuit and a transmission path from the memory circuit to the PLL control circuit are shortened. Accordingly, the restriction imposed on designing of the PLL circuit is alleviated.

CITATION LIST

Patent Literature

PTL 1: Japanese Patent Application Laid-Open No. 2004-341881

SUMMARY OF THE INVENTION

Technical Problem

In the technique described in patent literature 1, there still remains room for consideration on shortening of a wiring length in a case where a plurality of boards on which electronic components requiring high-speed communication are mounted are connected to each other by connectors.

An object of the present invention is to provide an electronic control device capable of suppressing deterioration of quality of a communication signal that electronic components requiring high-speed communication transmit and receive via connectors when a plurality of boards are connected to each other by the connectors.

Solution to Problem

In order to solve the above problem, for example, an electronic control device according to the present invention adopts the configurations described in claims.

The electronic control device according to the present application that includes a plurality of units to solve the above problems. To name one example of the electronic control device, the electronic control device includes: a first board on which a bus bridge and an external communication connector are mounted; a second board on which an accelerator SoC is mounted, the second board being electrically connected to the first board; and a first B-to-B connector capable of performing signal transmission between the bus bridge and the accelerator SoC.

Advantageous Effects of Invention

According to the electronic control device of the present invention, the electronic control device can suppress deterioration of quality of a communication signal that electronic components requiring high-speed communication transmit and receive via connectors when a plurality of boards are connected to each other by the connectors.

Problems, configurations, and advantageous effects other than those described above will become apparent by the following description of embodiments.

DESCRIPTION OF EMBODIMENTS

Hereinafter, embodiments of the present invention will be described in detail with reference to the drawings. In the present specification and the drawings, constitutional elements having substantially the same function or configuration are denoted by the same symbols, and the repeated description of these constitutional elements is omitted.

Figure 1:
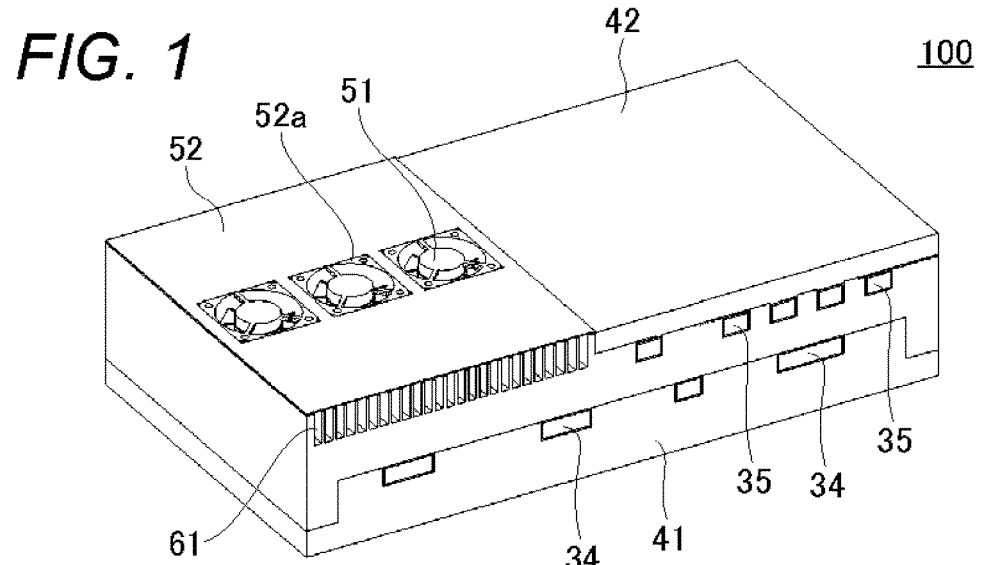
FIG. 1 is a perspective view schematically illustrating an external appearance of an electronic control device according to an embodiment.
Figure 2:
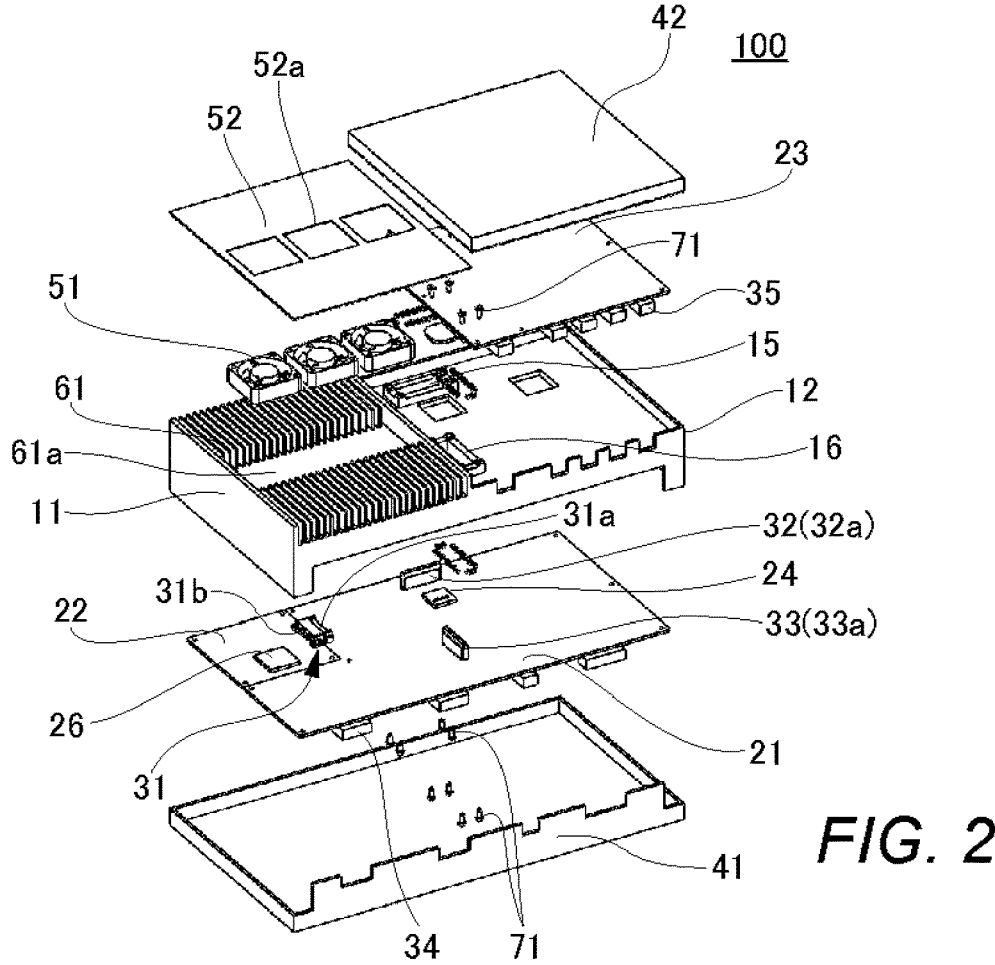
FIG. 2 is an exploded perspective view of the electronic control device according to the embodiment as viewed from above.
Figure 3:
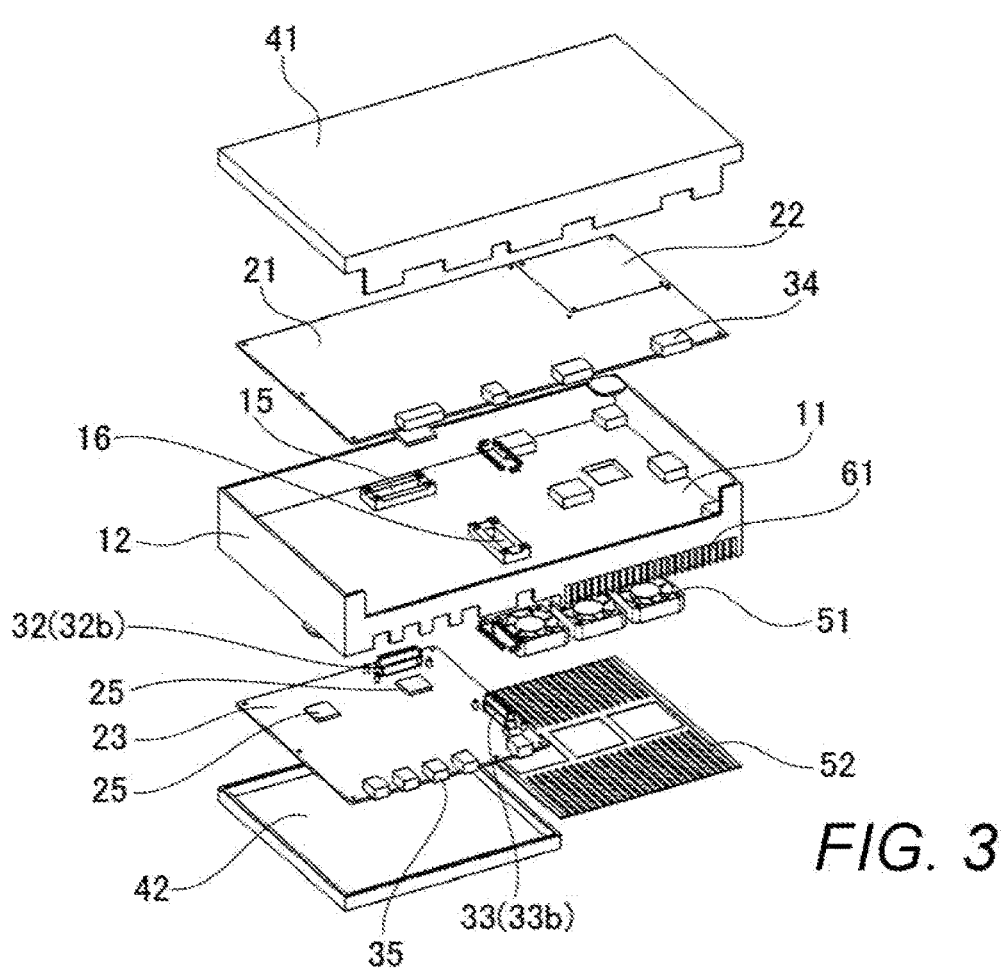
FIG. 3 is an exploded perspective view of the electronic control device according to the embodiment as viewed from below.
Figure 4:
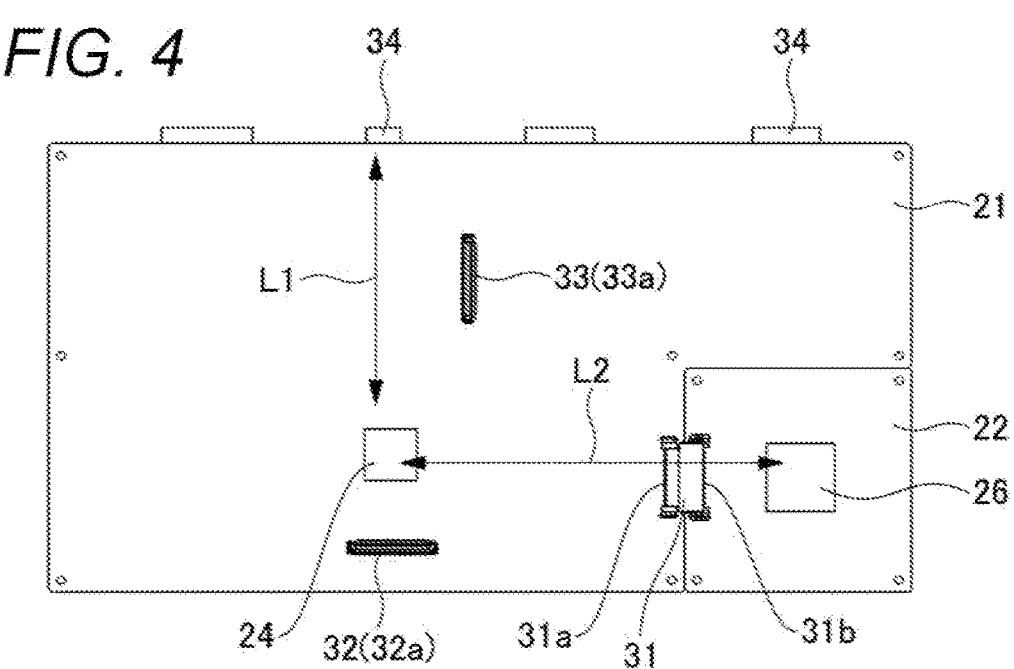
FIG. 4 is a plan view illustrating configurations of a first board and a second board that the electronic control device according to the embodiment includes.
Figure 5:
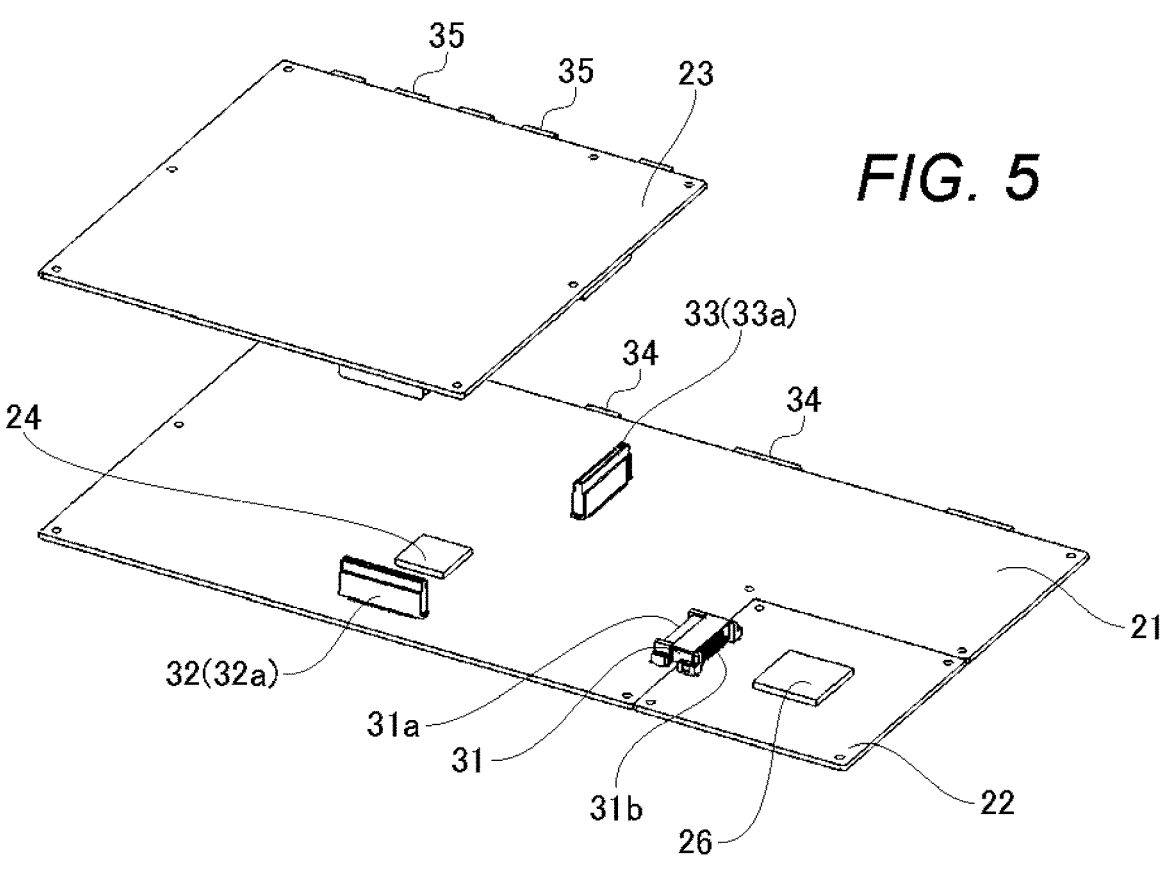
FIG. 5 is an exploded perspective view illustrating the first board and the second board that the electronic control device according to the embodiment includes.
Figure 6:
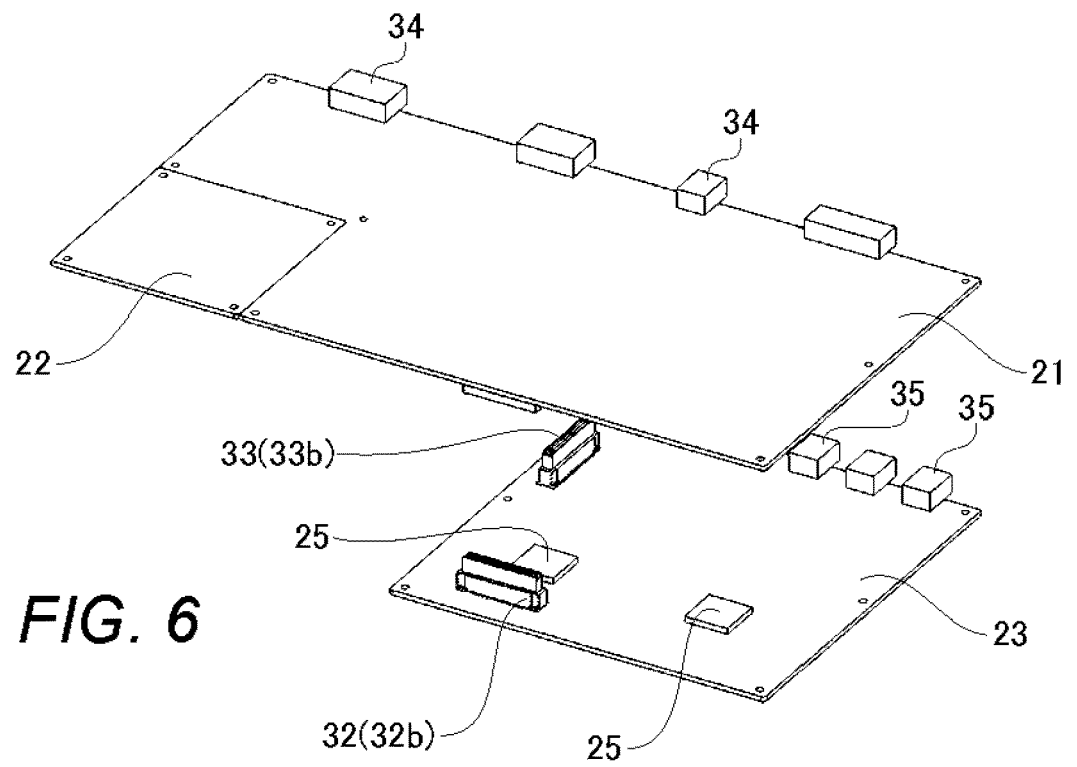
FIG. 6 is an exploded perspective view illustrating the configurations of the first board and second board that the electronic control device according to the embodiment includes.

FIG. 1 is a perspective view schematically illustrating an external appearance of an electronic control device according to an embodiment. FIG. 2 is an exploded perspective view of the electronic control device according to the embodiment as viewed from above, and FIG. 3 is an exploded perspective view of the electronic control device according to the embodiment as viewed from below. FIG. 4 is a plan view illustrating configurations of a first board and a second board that the electronic control device according to the embodiment includes. FIG. 5 is an exploded perspective view, as viewed from above, of the first board and the second board that the electronic control device according to the embodiment includes. FIG. 6 is an exploded perspective view, as viewed from below, of the first board and the second board that the electronic control device according to the embodiment includes.

As illustrated in FIG. 1 to FIG. 6, an electronic control device 100 is an electronic control device (ECU) that is used in an automobile, for example. The electronic control device 100 includes a housing 11, a first board 21, a second board 22, a third board 23, a first cover 41, a second cover 42, and a fan cover 52. The first board 21, the second board 22, and the third board 23 are respectively circuit boards (printed circuit boards) each having a wiring pattern. The first board 21 corresponds to a motherboard, and the second board 22 and the third board 23 respectively correspond to daughter boards. In this manner, by dividing the board incorporated in the electronic control device 100 into the first board 21, the second board 22, and the third board 23 as circuit boards independent from each other, it is possible to cope with the difference in the type of an automobile or in the function of the automobile by flexibly changing any one or two boards.

In the present embodiment, the configuration of the electronic control device is described hereinafter by assuming a side on which the first cover 41 is disposed as viewed from the housing 11 as a lower side, and a side on which the second cover 42 is disposed as viewed from the housing 11 as an upper side. However, the up-down direction (vertical direction) and the left-and-right direction (horizontal direction) may change depending on the direction of the electronic control device 100 when the electronic control device 100 is mounted on the vehicle.

(Housing 11)

The housing 11 is made of, for example, a metal material such as aluminum or an aluminum alloy, for example. Therefore, the housing 11 has electric conductivity and thermal conductivity. Heat radiation fins 61 are formed on the housing 11. The heat radiation fins 61 are plate-shaped fins formed on an upper surface side of the housing 11. The heat radiation fins 61 are preferably be integrally formed with the housing 11. A peripheral wall 12 is formed on an outer peripheral portion of the housing 11.

Two holes 15, 16 are formed in the housing 11. The respective holes 15, 16 are holes through which the B-to-B connectors 32, 33 are inserted in order to electrically connect the first board 21 and the second board 22 to each other by the B-to-B connectors 32, 33 described later. That is, the respective holes 15, 16 are holes for connector connection. The respective holes 15, 16 are formed such that the holes 15, 16 penetrate the housing 11 in the thickness direction (up-down direction).

(First Board 21)

The first board 21 is a board disposed in the housing 11. The first board 21 is mounted on a lower surface side of the housing 11. A bus bridge 24 is mounted on an upper surface of the first board 21. The bus bridge 24 is formed of a surface-mount-type package. As an example of the surface-mount-type package that forms the bus bridge 24, a ball grid array (BGA) package can be named. The bus bridge 24 is disposed such that the bus bridge 24 is brought into contact with a lower surface of the housing 11 by way of a heat radiation material (for example, heat radiation grease) not illustrated. With such a configuration, heat generated by the bus bridge 24 during high-speed communication is transferred from the bus bridge 24 to the housing 11. The first board 21 is disposed such that the first board 21 faces the third board 23 in the up-down direction that is the direction perpendicular to the surface of the first board 21. In this manner, by arranging the third board 23 in the direction perpendicular to the board surface of the first board 21, it is possible to suppress the size of the entire electronic control device 100 in the left-right small direction compared with a case where these boards are arranged side by side in the left-right direction.

In addition to the bus bridge 24 described above, a connector half body 31a, a connector half body 32a, and a connector half body 33a are mounted on an upper surface of the first board 21. The connector half body 31a is a connector having a male/female relationship with a connector half body 31b mounted on the second board 22. The connector half body 31a engages with the connector half body 31b by fitting engagement. A B-to-B connector 31 corresponds to a first B-to-B connector, and is formed of the connector half body 31a and the connector half body 31b. A connector half body 32a engages with a connector half body 32b by fitting engagement in assembling the electronic control device 100. The connector half body 33a engages with the connector half body 33b by fitting engagement in assembling the electronic control device 100. Further, a plurality of external communication connectors 34 are mounted on a lower surface of the first board 21. The external communication connector 34 is disposed along one side of the first board 21. As illustrated in FIG. 4, the bus bridge 24 is disposed between the B-to-B connector 32 and the external communication connector 34. Specifically, the connector half body 32a of the B-to-B connector 32 is disposed on an extension line of a straight line L1 that connects any one of the external communication connectors 34 among the plurality of external communication connectors 34 and the bus bridge 24 to each other. Wiring (not illustrated) electrically connecting the bus bridge 24 and the external communication connector 34 is formed along the straight line L1. Wiring (not illustrated in the drawings) that electrically connects the bus bridge 24 and the connector half body 32a is also formed along an extension line of the straight line L1.

(Second Board 22)

The second board 22 is a board that is electrically connected to the first board 21. The second board 22 is disposed on the same plane as the first board 21. The second board 22 is disposed in a direction horizontal to a board surface of the first board 21. The second board 22 is disposed in a region where heat radiation fins 61 are formed. The second board 22 is mounted on a lower surface side of the housing 11 together with the first board 21 An accelerator system on chip (SoC) 26 is mounted on an upper surface of the second board 22. The accelerator SoC 26 is formed of a surface-mount-type package (for example, a BGA package). The accelerator SoC 26 is disposed such that the accelerator SoC 26 is brought into contact with a lower surface of the housing 11 by way of a heat radiation material (for example, heat radiation grease) not illustrated in the drawings. As a result, heat that is generated by the accelerator SoC 26 during high-speed communication is transmitted from the accelerator SoC 26 to the housing 11.

In addition to the accelerator SoC 26 described above, the connector half body 31b is mounted on an upper surface of the second board 22. The connector half body 31b is mounted on an upper surface of the second board 22. The connector half body 31b engages with the connector half body 31a from the horizontal direction. With such a configuration, the first board 21 and the second board 22 are horizontally connected to each other by the B-to-B connector 31. In addition, the B-to-B connector 31 is a B-to-B connector capable of signal transmission between the bus bridge 24 and the accelerator SoC 26, and is disposed between the bus bridge 24 and the accelerator SoC 26 as illustrated in FIG. 4. Specifically, the B-to-B connector 31 is disposed on a straight line L2 that connects the bus bridge 24 and the accelerator SoC 26 to each other. Wiring (not illustrated in the drawings) that electrically connects the bus bridge 24 and the connector half body 31a to each other is formed along the straight line L2. Wiring (not illustrated) that electrically connects the accelerator SoC 26 and the connector half body 31b is also formed along the straight line L2.

(Third Board 23)

The third board 23 is a board that is electrically connected to the first board 21, and is mounted on an upper surface side of the housing 11. The third board 23 is disposed in a direction perpendicular to a board surface of the first board 21. The third board 23 is disposed at a position adjacent to heat radiation fins 61 on an upper surface side of the housing 11. As illustrated in FIG. 3, two image processing system on chips (SoCs) 25 are mounted on a lower surface of the third board 23. The image processing SoC 25 is formed of a surface-mount-type package. As an example of the surface-mount-type package that forms the image processing SoC 25, a ball grid array (BGA) package can be named. The image processing SoC 25 is disposed such that the image processing SoC 25 is brought into contact with an upper surface of the housing 11 by way of a heat radiation material (not illustrated in the drawings). With such a configuration, heat that is generated by the image processing SoC 25 during high-speed communication is transmitted from the image processing SoC 25 to the housing 11. The heat radiation material is made of heat radiation grease, for example.

In addition to the image processing SoC 25 described above, a connector half body 32b and a connector half body 33b are mounted on a lower surface of the third board 23. The connector half body 32b is a connector having a male/female relationship with the connector half body 32a mounted on the first board 21. The connector half body 32b engages with the connector half body 32a by fitting engagement. The B-to-B connector 32 corresponds to a second B-to-B connector, and is formed of the connector half body 32a and the connector half body 32b. The B-to-B connector 32 is a B-to-B connector capable of signal transmission between the bus bridge 24 and the image processing SoC 25. The connector half body 33b is a connector having a male/female relationship with the connector half body 33a mounted on the first board 21. The connector half body 33b engages with the connector half body 33a by fitting engagement. The B-to-B connector 33 is formed of the connector half body 33a and the connector half body 33b. Further, a plurality of external communication connectors 35 are mounted on a lower surface of the third board 23. The external communication connector 35 is disposed along one side of the third board 23.

Figure 7:
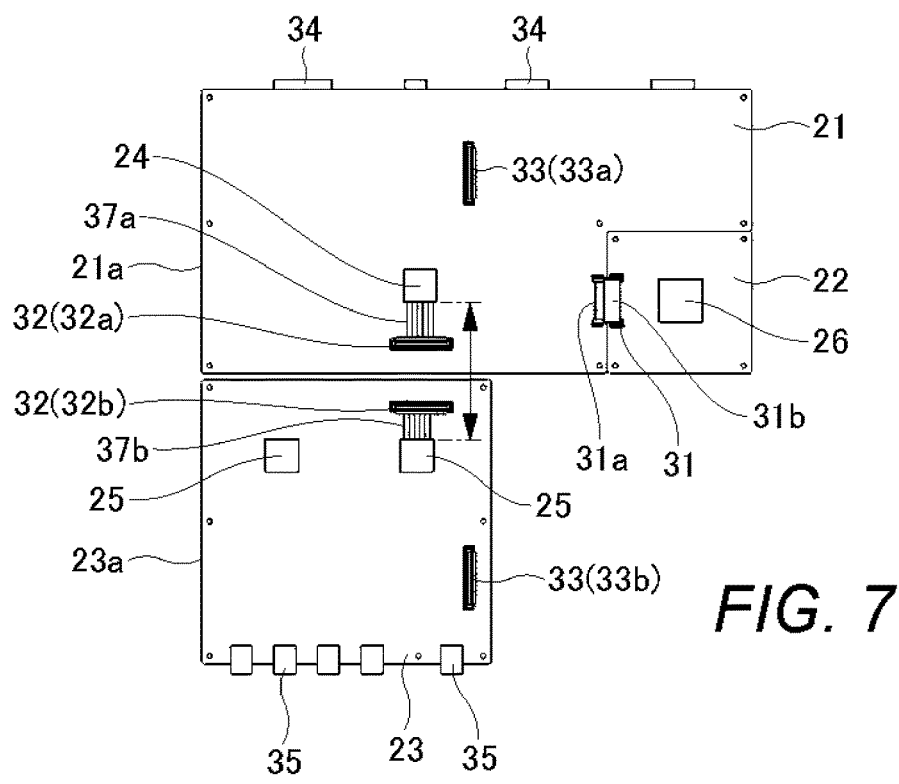
FIG. 7 is a view illustrating configurations of a first board, a second board and a third board that an electronic control device according to the embodiment includes.

FIG. 7 is a view illustrating configurations of a first board, a second board and a third board that another electronic control device according to an embodiment includes. FIG. 7 is a developed view illustrating a state where the first board 21, the second board 22, and the third board 23 are developed side by side on the same plane, and upper surfaces of the first board 21 and the second board 22 and a lower surface of the third board 23 are viewed from respective front sides.

As illustrated in FIG. 7, a wiring 37a is formed on an upper surface of the first board 21. The wiring 37a is a wiring that electrically connects a bus bridge 24 and a connector half body 32a of a B-to-B connector 32. The wiring 37a is formed along one side (short side) 21a of the first board 21. On the other hand, a wiring 37b is formed on a lower surface of the third board 23. The wiring 37b is a wiring that electrically connects an image processing SoC 25 and a connector half body 32b of the B-to-B connector 32. The wiring 37b is formed along one side 23a of the third board 23 to each other. By making an upper surface of the first board 21 and a lower surface of the third board 23 face each other and by making the connector half bodies 32a, 32b engage with each other by fitting engagement, the wiring 37a and the wiring 37b are disposed in a state where the wiring 37a and the wiring 37b face each other and are in parallel to each other. With such a configuration, a length of a wiring between the bus bridge 24 and the image processing SoC 25 can be shortened and hence, the degradation of quality of communication signals can be suppressed.

Further, as illustrated in FIG. 7, on the upper surface of the first board 21, the connector half body 32a of the B-to-B connector 32 is disposed at an end of the first board 21. On the other hand, on the lower surface of the third board 23, the connector half body 32b of the B-to-B connector 32 is disposed at an end of the third board 23. Further, the first board 21 is fastened to a housing 11 by screws 71 around the B-to-B connector 32. The third board 23 is also fastened to the housing 11 by screws 71 around the B-to-B connector 32. With such a configuration, it is possible to suppress the displacement in fitting engagement of the B-to-B connector 32 caused by vibrations or the like.

Further, as illustrated in FIG. 7, on the upper surface of the first board 21, the connector half body 32a of the B-to-B connector 32 is disposed parallel to a longitudinal direction of the first board 21. On the other hand, on the lower surface of the third board 23, the connector half body 32b of the B-to-B connector 32 is disposed parallel to the longitudinal direction of the first board 21. The longitudinal direction of the first board 21 is the same direction as the longitudinal direction of the housing 11. The B-to-B connector 32 is made to pass through a hole 15 formed in the housing 11. The direction of the hole 15 is set so as to agree with the directions of the connector half bodies 32a, 32b. The longitudinal direction of the connector half bodies 32a, 32b is the same direction as the longitudinal direction of the first board 21 and the longitudinal direction of the housing 11.

With such a configuration, the longitudinal direction of the hole 15 is parallel to the longitudinal direction of the housing 11.

In the above-described configuration, air is present in the hole 15. A heat transfer coefficient of air is significantly lower than a heat transfer coefficient of a metal material (solid body portion) by which the housing 11 is made. Therefore, when a longitudinal direction of the hole 15 is perpendicular to a longitudinal direction of the housing 11, an actual size of the housing 11 that contributes to heat transfer from one side (a side opposite to heat radiation fins 61) to the other side (a heat radiation fin 61 side) in the longitudinal direction of the housing 11 becomes narrow. On the other hand, when the longitudinal direction of the hole 15 is parallel to the longitudinal direction of the housing 11, it is possible to secure a wide actual size of the housing 11 that contributes to heat transfer from one side to the other side in the longitudinal direction of the housing 11. Therefore, in the configuration where the hole 15 is formed in the housing 11, it is possible to suppress the resistance to heat transfer caused by the presence of the hole 15. Therefore, heat that is generated in the bus bridge 24 and the image processing SoC 25 can be smoothly transferred to the heat radiation fins 61.

(First Cover 41)

A first cover 41 is a cover that covers the first board 21 and the second board 22. An upper surface of the first cover 41 is disposed in a facing manner with the lower surface of the first board 21 and the lower surface of the second board 22. The lower surface of the housing 11 is disposed in a facing manner with the upper surface of the first board 21 and the upper surface of the second board 22. Therefore, the first board 21 and second board 22 are disposed in a space formed by the housing 11 and the first cover 41 in the vertical direction. The first cover 41 is formed in a quadrangular shape in a plan view with a dimension larger than the dimension of the outermost peripheral portion of the first board 21 and the second board 22 so as to shield the entire area of the first board 21 and the second board 22. The first cover 41 is made of, for example, a metal material such as a ferroalloy, more specifically, a plated steel plate or the like. By providing the first cover 41 in the electronic control device 100, it is possible to prevent intrusion of dust or the like from the outside to the inside of the electronic control device 100 by the first cover 41 and to suppress occurrence of contamination. In addition, by covering the first board 21 and the second board 22 with the first cover 41, an access to the first board 21 and the second board 22 from the outside can be prevented by the first cover 41. Accordingly, it is possible to protect the first board 21 and the second board 22 from an external damage or the like.

(Second Cover 42)

The second cover 42 is a cover that covers the third board 23. A lower surface of the second cover 42 is disposed in a facing manner with the upper surface of the third board 23. An upper surface of the housing 11 is disposed in a facing manner with the lower surface of the third board 23. Therefore, the third board 23 is disposed in a space formed by the housing 11 and the second cover 42 in the vertical direction. The second cover 42 is formed in a quadrangular shape as viewed in a plan view. The second cover 42 has a size larger than a size of an external profile of the third board 23 so as to shield an entire area of the third board 23. The second cover 42 is made of, for example, a metal material such as a ferroalloy, more specifically, a plated steel plate or the like. By providing the second cover 42 in the electronic control device 100, it is possible to prevent the intrusion of dust or the like from the outside to the inside of the electronic control device 100 by the second cover 42 thus suppressing the occurrence of contamination. In addition, by covering the third board 23 with the second cover 42, an access to the third board 23 from the outside can be prevented by the second cover 42. Accordingly, it is possible to protect the third board 23 from an external damage or the like.

(Fan Cover 52)

The fan cover 52 is a cover provided so as to cover heat radiation fins 61. Three openings 52a are formed in the fan cover 52. Three openings 52a are openings for ventilation, and are formed corresponding to three fans 51. The fan 51 is a fan for forced air cooling. The number of fans 51 can be changed as necessary. The fans 51 may be provided as necessary, and the fan covers 52 may also be provided as necessary. The openings 52a serve as air intake ports for taking air from the outside of the electronic control device 100 into the fans 51 when the fans 51 are driven. The fans 51 are arranged in a line in an intermediate portion 61a of the heat radiation fin 61. An intermediate portion 61a of the heat radiation fin 61 is formed in a groove shape with no fin structure. The fan cover 52 is attached to the upper surface side of the housing 11 together with the second cover 42. The fan cover 52 is disposed adjacent to the second cover 42. The fan cover 52 is formed into a quadrangular shape as viewed in a plan view. The fan cover 52 has a size that corresponds to a size of heat radiation fins 61. The fan cover 52 is made of a metal material.

When three fans 51 are driven in a state where the fan cover 52 is mounted on an upper surface side of the housing 11, air is sucked into the fans 51 from respective opening 52a, and the sucked air flows into the heat radiation fins 61 by an air supply function of the fans 51. With such a configuration, an air flow is formed along the heat radiation fins 61. Therefore, the entire heat radiation fins 61 can be cooled. Furthermore, heat that is generated by the image processing SoC 25 during high-speed communication is transferred to the heat radiation fins 61 of the housing 11. Therefore, by cooling the heat radiation fins 61 by air using the fins 51, the heat that is generated by the image processing SoC 25 can be efficiently released to the outside of the housing 11. Further, heat that is generated by the accelerator SoC 26 during high-speed communication is also transferred to the heat radiation fins 61 of the housing 11. Accordingly, by air-cooling the heat radiation fins 61 by the fans 51, the heat that is generated by the accelerator SoC 26 can be efficiently released to the outside of the housing 11.

The electronic control device 100 having the above-described configuration is assembled by the following steps, for example.

First, the connector half body 31a mounted on the first board 21 and the connector half body 31b mounted on the second board 22 are made to engage with each other by fitting engagement. With such a configuration, the first board 21 and the second board 22 are horizontally connected to each other by the B-to-B connector 31. Therefore, a large amount of data can be communicated between the first board 21 and the second board 22 at high speed via the B-to-B connector 31.

Next, the first board 21 and the second board 22 are mounted on the lower surface side of the housing 11. At this stage of the assembling operation, the connector half bodies 32a and 33a mounted on the first board 21 are disposed in the inside of the corresponding holes 15 and 16 respectively. Then, the first board 21 and the housing 11 are fastened to each other by the screws 71 (see FIG. 1).

Next, the first cover 41 is mounted on the lower surface side of the housing 11 such that the first cover 41 covers the first board 21 and the second board 22. At this stage of the assembling operation, a gap formed between the first cover 41 and the external communication connector 34 and a gap formed between the first cover 41 and the housing 11 are sealed by a waterproof material (not illustrated in the drawings). The waterproof material prevents the intrusion of water from the outside to the inside of the electronic control device 100 so as to protect the boards 21 to 23 disposed in the electronic control device 100.

Next, three fans 51 are mounted on the upper surface side of the housing 11.

Then, the fan cover 52 is mounted on an upper surface side of the housing 11 such that the fan cover 52 covers the heat radiation fins 61.

Next, the third board 23 is mounted on the upper surface side of the housing 11. At this stage of the assembling operation, the connector half bodies 32b, 33b that are mounted on the third board 23 are disposed in the inside of the corresponding holes 15, 16 respectively. Then, the third board 23 and the housing 11 are fastened to each other by the screws 71 (see FIG. 1). Further, the connector half body 32b is made to engage with the connector half body 32a by fitting engagement, and the connector half body 33b is made to engage with the connector half body 33a by fitting engagement. By performing such steps, the first board 21 and the third board 23 are vertically connected to each other by the B-to-B connector 32 and the B-to-B connector 33. Further, the connector half bodies 33b, 33b that form the B-to-B connector 33 are arranged in the space formed in the hole 16, and the connector half bodies 33b, 33b are connected to each other in this space. Further, the connector half bodies 32b, 32b that form the B-to-B connector 32 are arranged in the space formed in the hole 15, and the connector half bodies 32b, 32b are connected to each other in this space.

By connecting the third board 23 and the first board 21 to each other by the B-to-B connector 32 and the B-to-B connector 33 in this manner, a large amount of data can be communicated at high speed between the third board 23 and the first board 21 via the B-to-B connector 32 and the B-to-B connector 33.

Next, the second cover 42 is mounted on the upper surface side of the housing 11 such that the second cover 42 covers the third board 23. At this stage of the assembling operation, a gap formed between the second cover 42 and the external communication connector 35 and a gap formed between the second cover 42 and the housing 11 are sealed by a waterproof material (not illustrated in the drawings). The reason for providing the waterproof material is as described above.

By performing the above-described steps, the assembly of the electronic control device 100 is completed.

It must be noted that the assembly steps of the electronic control device 100 are not limited to the above-described steps, and can be changed as appropriate.

Advantageous Effects of Embodiment

In the embodiment described above, the first board 21 and the second board 22 are connected to each other by the B-to-B connector 31, and signal transmission between the bus bridge 24 and the accelerator SoC 26 is performed via the B-to-B connector 31. Accordingly, it is possible to suppress the degradation of quality of communication signals in implementing high-speed data communication between the bus bridge 24 and the external communication connector 34 and high-speed data communication between the bus bridge 24 and the accelerator SoC 26.

Further, in the embodiment, the B-to-B connector 31 is disposed between the bus bridge 24 and the accelerator SoC 26. Accordingly, a length of the wiring between the bus bridge 24 and the accelerator SoC 26 can be shortened and hence, the degradation of the quality of communication signals can be suppressed.

In the embodiment, the first board 21 and the third board 23 are connected to each other by the B-to-B connectors 32, 33, and signal transmission between the bus bridge 24 and the accelerator SoC 25 is performed via the B-to-B connectors 32, 33. Accordingly, it is possible to suppress the degradation of quality of communication signals in implementing high-speed data communication between the bus bridge 24 and the accelerator SoC 26.

Further, in the embodiment, the bus bridge 24 is disposed between the B-to-B connector 32 and the external communication connector 34. Accordingly, a length of the wiring between the bus bridge 24 and the external communication connector 34 and a length of the wiring between the bus bridge 24 and the B-to-B connector 32 are shortened and hence, the degradation of the quality of communication signals can be suppressed.

In the embodiment, the second board 22 is disposed in a direction horizontal to the board surface of the first board 21, and the third board 23 is disposed in a direction perpendicular to the board surface of the first board 21. With such a configuration, a length of wiring in the case of electrically connecting the first board 21 and the second board 22 to each other can be shortened, and a length of wiring in the case of electrically connecting the first board 21 and the third board 23 to each other can be shortened.

Modifications and the Like

The present invention is not limited to the above-described embodiments, and includes various modifications of these embodiments. For example, in the above-described embodiments, the content of the present invention has been described in detail for facilitating the understanding of the invention. However, the present invention is not necessarily limited to the content that includes all configurations described in the above-described embodiments. A part of the configuration of one embodiment can be replaced with the configuration of another embodiment. The configuration of one embodiment can be added to the configuration of another embodiment. In addition, with respect to a part of the configuration of each embodiment, the part can be deleted, other configurations can be added to the part, or the part is replaced with other configurations.

For example, the arrangement of the B-to-B connector 32 which is the second B-to-B connector is not limited to the arrangement illustrated in FIG. 7. For example, the B-to-B connector 32 may be arranged as illustrated in FIG. 8, FIG. 9, or FIG. 10.

Figure 8:
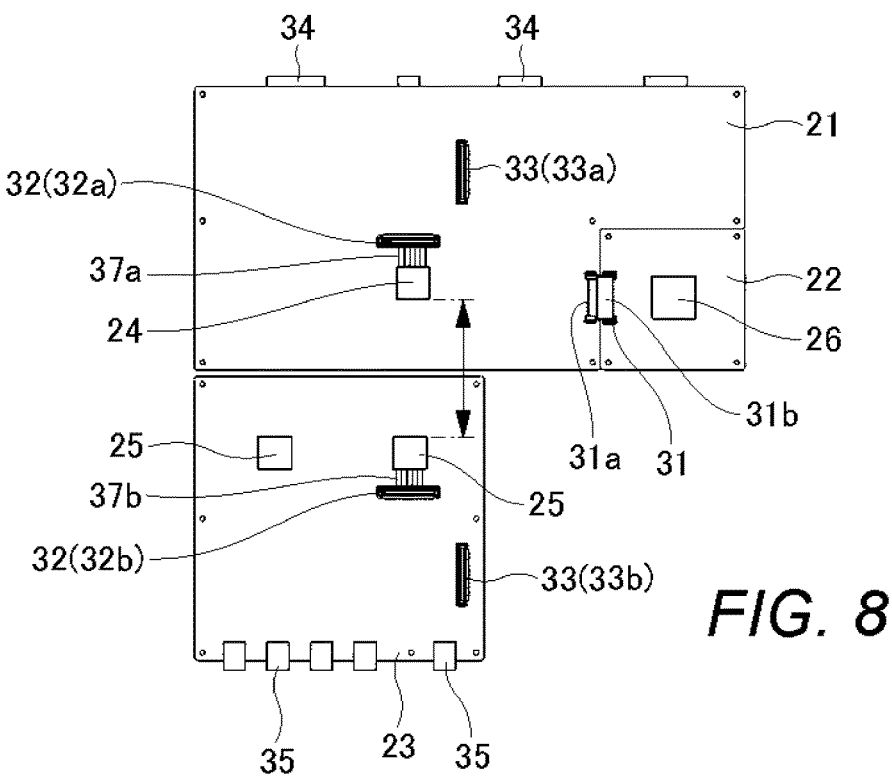
FIG. 8 is a view illustrating another arrangement example (part 1) of a second B-to-B connector.
Figure 9:
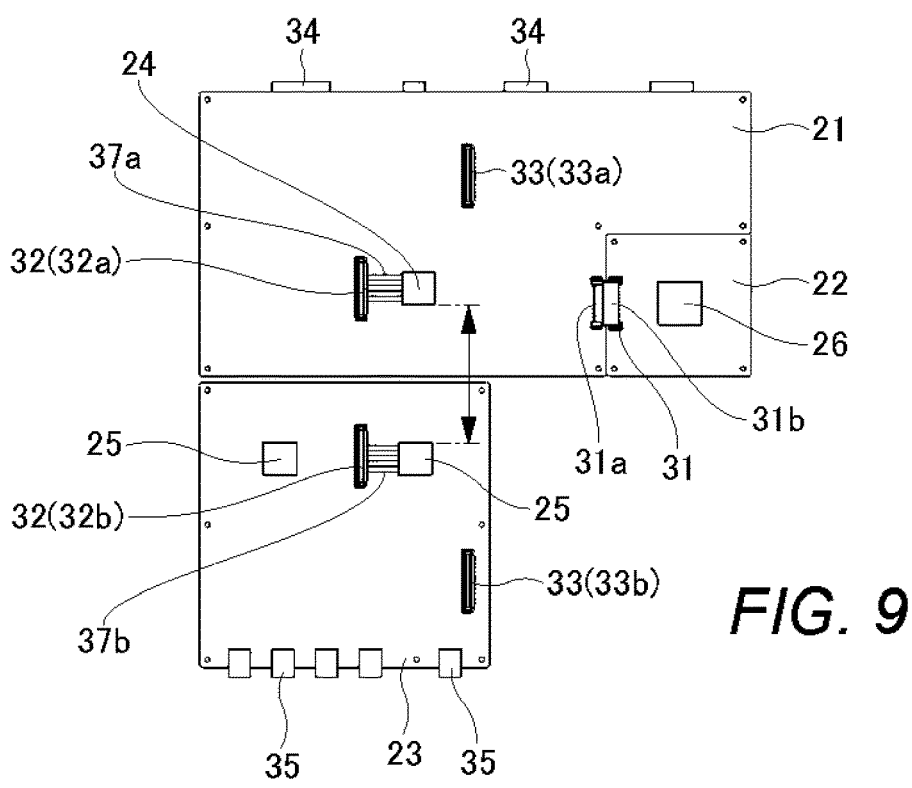
FIG. 9 is a view illustrating still another arrangement example (part 2) of the second B-to-B connector.
Figure 10:
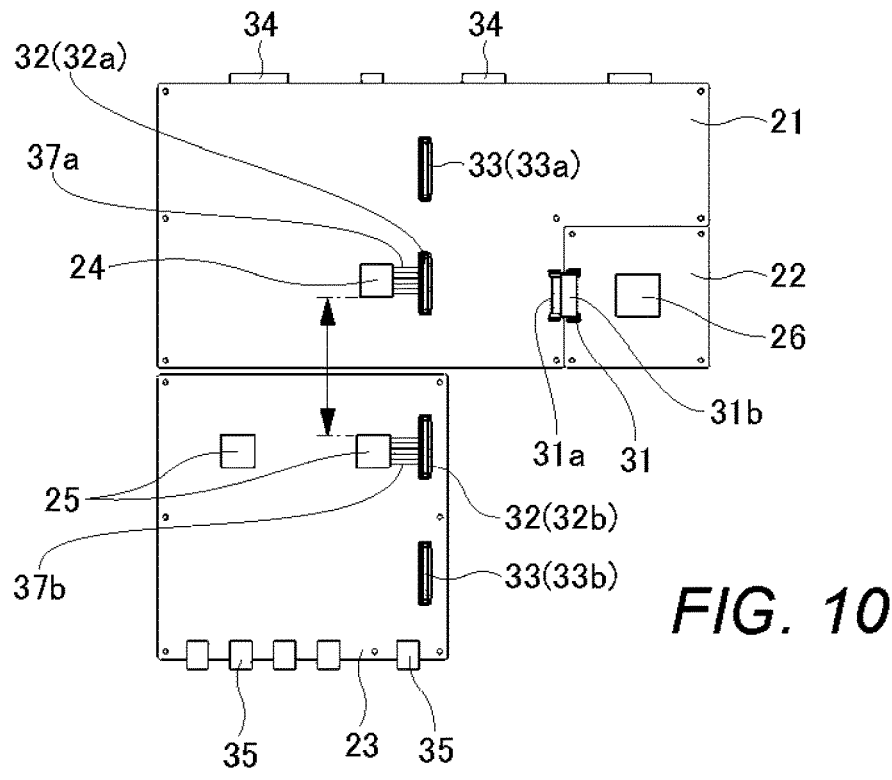
FIG. 10 is a view illustrating further still another arrangement example (part 3) of the second B-to-B connector.

FIG. 8, FIG. 9 and FIG. 10 are developed views illustrating a state where the first board 21, the second board 22, and the third board 23 are developed side by side on the same plane, and upper surfaces of the first board 21 and the second board 22 and a lower surface of the third board 23 are viewed from respective front sides.

As illustrated in FIG. 8, on the upper surface of the first board 21, the connector half body 32a of the B-to-B connector 32 is disposed parallel to a longitudinal direction of the first board 21. On the other hand, on the lower surface of the third board 23, the connector half body 32b of the B-to-B connector 32 is disposed parallel to the longitudinal direction of the first board 21. Further, on the upper surface of the first board 21, the connector half body 32*a* of the B-to-B connector 32 is disposed at a position closer to a center portion of the first board 21 than the bus bridge 24. On the other hand, on the lower surface of the third board 23, the connector half body 32*b* of the B-to-B connector 32 is disposed at a position closer to a center portion of the third board 23 than the image processing SoC 25. Further, a wiring 37*a* is formed between the bus bridge 24 and the connector half body 32*a*, and a wiring 37*b* is formed between the image processing SoC 25 and the connector half body 32*b*.

On the other hand, as illustrated in FIG. 9, on the upper surface of the first board 21, the connector half body 32*a* of the B-to-B connector 32 is disposed parallel to a lateral direction of the first board 21. On the other hand, on the lower surface of the third board 23, the connector half body 32*b* of the B-to-B connector 32 is disposed parallel to the lateral direction of the first board 21. Further, on the upper surface of the first board 21, the connector half body 32*a* of the B-to-B connector 32 is disposed at a position closer to an end of the first board 21 than the bus bridge 24. On the other hand, on the lower surface of the third board 23, the connector half body 32*b* of the B-to-B connector 32 is disposed at a position closer to the center portion of the third board 23 than the image processing SoC 25. Further, a wiring 37*a* is formed between the bus bridge 24 and the connector half body 32*a*, and a wiring 37*b* is formed between the image processing SoC 25 and the connector half body 32*b*.

As illustrated in FIG. 10, on the upper surface of the first board 21, the connector half body 32*a* of the B-to-B connector 32 is disposed parallel to a lateral direction of the first board 21. On the other hand, on the lower surface of the third board 23, the connector half body 32*b* of the B-to-B connector 32 is disposed parallel to the lateral direction of the first board 21. Further, on the upper surface of the first board 21, the connector half body 32*a* of the B-to-B connector 32 is disposed at a position closer to a center portion of the first board 21 than the bus bridge 24. On the other hand, on the lower surface of the third board 23, the connector half body 32*b* of the B-to-B connector 32 is disposed at a position closer to an end portion side of the third board 23 than the image processing SoC 25. Further, a wiring 37*a* is formed between the bus bridge 24 and the connector half body 32*a*, and a wiring 37*b* is formed between the image processing SoC 25 and the connector half body 32*b*.

Also in the cases where the B-to-B connector 32 is connected as described above, a length of a wiring between the bus bridge 24 and the image processing SoC 25 can be shortened and hence, the degradation of quality of communication signals can be suppressed.

In addition, in the above-described embodiments, the description has been made by taking the electronic control device used in an automobile (electronic control device for a vehicle) as an example. However, the electronic control device according to the present invention may be used for applications other than an automobile.

REFERENCE SIGNS LIST

21 first board
22 second board
23 third board
24 bus bridge
25 image processing SoC

12

26 accelerator SoC
31 B-to-B connector (first B-to-B connector)
32 B-to-B connector (second B-to-B connector)
33 B-to-B connector
34 external communication connector
100 electronic control device

The invention claimed is:

1. An electronic control device, comprising:
a bus bridge that is thermally coupled to a housing of the electronic control device;
a first board on which the bus bridge and an external communication connector are mounted, wherein the external communication connector is arranged on an edge of the first board;
a second board on which an accelerator System on a Chip (SoC) is mounted, the second board being mechanically coupled and electrically connected to the first board, wherein in a plan view the accelerator SoC is aligned with the bus bridge in a first direction when the second board is mechanically coupled to the first board;
a first Board to Board (B-to-B) connector that transmits a signal between the bus bridge and the accelerator SoC, wherein the first B-to-B connector comprises mating connector halves mounted directly on the first board and the second board, respectively, and positioned on surfaces of the boards that face each other, and wherein in the plan view the external communication connector is aligned in a second direction with the first B-to-B connector when the second board is mechanically coupled to the first board, and the first direction and the second direction are orthogonal;
a third board on which an image processing SoC is mounted, the third board being electrically connected to the first board; and
a second B-to-B connector that transmits a signal between the bus bridge and the image processing SoC,
wherein the external communication connector is disposed along one side edge of the first board and the bus bridge lies between the external communication connector and the second B-to-B connector, the connector half of the second B-to-B connector on the first board being disposed at an end portion of the first board on an extension of a straight line connecting the external communication connector and the bus bridge, the second B-to-B connector passing through a hole in the housing whose longitudinal direction is parallel to a longitudinal direction of the housing, and the first board and the third board are fastened to the housing at locations surrounding the second B-to-B connector to suppress displacement of the connector caused by vibration.

2. The electronic control device according to claim 1, wherein the first B-to-B connector is disposed between the bus bridge and the accelerator SoC.

3. The electronic control device according to claim 1, wherein the bus bridge is disposed between the second B-to-B connector and the external communication connector.

4. The electronic control device according to claim 1, wherein
the third board is mechanically coupled to the first board.

5. The electronic control device according to claim 1, wherein the external communication connector extends beyond the edge of the first board in a direction that is co-planar to a surface of the first board.

* * * * *